United States Patent [19]

Stout et al.

[11] Patent Number: 5,240,817

[45] Date of Patent: Aug. 31, 1993

[54] LAMINATION OF A PHOTOPOLYMERIZABLE SOLDER MASK LAYER TO A SUBSTATE CONTAINING HOLES USING AN INTERMEDIATE PHOTOPOLYMERIZABLE LIQUID LAYER

[75] Inventors: Gary Stout, Gloucester City, N.J.; Robert W. Ashcraft, Towanda, Pa.

[73] Assignee: E. I. du Pont de Nemours and Company, Wilmington, Del.

[21] Appl. No.: 811,358

[22] Filed: Dec. 20, 1991

[51] Int. Cl.$^5$ .............................. G03C 5/58; G03F 7/16
[52] U.S. Cl. ...................................... 430/315; 430/312; 430/324; 430/328; 430/330; 430/273; 427/96; 156/295; 156/273.7
[58] Field of Search ............... 430/315, 324, 273, 312, 430/330, 328; 427/96; 156/295, 273.7

[56] References Cited

U.S. PATENT DOCUMENTS

| | | | |
|---|---|---|---|
| 3,629,036 | 2/1969 | Isaacson | 156/247 |
| 4,069,076 | 1/1978 | Fickes | 156/83 |
| 4,293,635 | 10/1981 | Flint et al. | 430/281 |
| 4,698,294 | 10/1987 | Lau et al. | 430/325 |
| 4,710,262 | 12/1987 | Weed | 430/315 |
| 4,966,827 | 10/1990 | Sullivan | 430/270 |

FOREIGN PATENT DOCUMENTS 0259853 9/1987 European Pat. Off. .

*Primary Examiner*—Christopher D. Rodee

[57] ABSTRACT

A process is disclosed for applying a preformed photopolymerizable solder mask film and a photosensitive liquid to a printed circuit substrate containing a plurality of holes wherein reduced failure is obtained in photopolymerized areas of the solder mask film above the holes as determined after a soldering operation. The photosensitive liquid contains at least one ethylenically unsaturated compound capable of forming a high polymer by addition polymerization and a first photoinitiator system which has an absorption maximum in a first spectral region. The preformed photopolymerizable film contains at least one ethylenically unsaturated compound capable of forming a high polymer by addition polymerization and a second photoinitiator system, such that the preformed photopolymerizable film has an absorption maximum in a second spectral region and is activated by actinic radiation therein and has an absorption minimum in the first spectral region and transmits actinic radiation therein.

13 Claims, No Drawings

LAMINATION OF A PHOTOPOLYMERIZABLE SOLDER MASK LAYER TO A SUBSTATE CONTAINING HOLES USING AN INTERMEDIATE PHOTOPOLYMERIZABLE LIQUID LAYER

BACKGROUND OF THE INVENTION

The present invention is directed to a process of lamination of photopolymerizable solder mask layer onto a printed circuit substrate containing a number of holes wherein a liquid is present during application of the layer to the substrate.

Related lamination processes are known in the prior art but each are considered defective when a relatively thin solder mask film is employed. Defects are introduced into the liquid/solder mask film in the area above holes in the substrate. Such defects are conventionally in the form of cracks which propagate into defects in later processing such as in application of molten solder.

A commercial process for lamination of liquid/solder mask film onto a printed board substrate is marketed by E. I. du Pont de Nemours and Company under a trademark, Valu ® solder mask lamination. However problems exist due to defects which occur in the film/liquid which is above holes in a substrate.

These defects are particularly troublesome for thinner films as 2.0 mils or less and particularly for 1.5 miles or less and for high aspects hole, i.e., when the ratio of the height of the hole to its diameter is at least 4 and more specifically at least 5.

U.S. Pat. No. 4,966,827 discloses various embodiments of obtaining printed wiring boards by means of a two layer composite coating. In one embodiment an adhesive photopolymer layer is applied to a printed wiring board in a liquid state displacing air from the printed wiring board surface. A dry film solder mask is temporarily adhered to the underside of a screen printing frame and applied onto the liquid layer prior to processing of the photopolymer layer. In another embodiment a layer of curable, 100 percent solids liquid of predetermined thickness is employed as the adhesive layer.

European Patent Application 87113176.9, discloses a process of laminating a photopolymerizable film which is preformed and nonliquid onto a substrate surface employing a photosensitive liquid of at least one monomer and a photoinitiator.

When a film/liquid lamination process of the prior art is employed to apply a thin solder mask of a thickness not greater than 2.0 mil to circuit boards containing high aspect ratio holes, an undesirable number of tent failures (i.e., failures above or immediately surrounding a hole on the film surface) have been observed after thermal curing and/or soldering wherein cracks are formed in the surface of the tent above the barrel of the hole. Such surface cracks may extend to the underlying circuit pad or they may be micro cracks confined to the surface area of the solder mask. In either case, the cracks absorb ionic contaminants during further processing which cannot be easily removed and which adversely impact the circuit board function. The number of tenting failures is further exacerbated when the thickness of the dry film is reduced, e.g., for use with surface mount technology.

There is an increasing industry need to use thinner solder mask layers to be compatible with the emerging surface mount technology and there is also a need to use such technology on high aspect ratio multilayer printed circuit boards having defect free tented or plugged holes.

SUMMARY OF THE INVENTION

The present invention is directed to a process for applying a photopolymerizable solder mask layer to a printed circuit substrate containing a plurality of holes which comprises the steps of (a) applying to the substrate surface, a photopolymerizable liquid to substantially fill the holes, the photopolymerizable liquid comprising at least one ethylenically unsaturated compound capable of forming a high polymer by addition polymerization and a first photoinitiator system which has an absorption maximum in a first spectral region and is activated by actinic radiation therein;

(b) laminating a preformed photopolymerizable film to the substrate through the applied liquid, the preformed photopolymerizable film having a thickness not greater than 2.0 mils comprising at least one ethylenically unsaturated compound capable of forming a high polymer by addition polymerization and a second photoinitiator system, wherein the preformed photopolymerizable film has an absorption maximum in a second spectral region and is activated by actinic radiation therein and has an absorption minimum in the first spectral region and transmits actinic radiation therein, with the proviso that the combination of the photopolymerizable liquid and preformed photopolymerizable film meets the requirements of Tenting Efficiency Test A (as described below);

(c) imagewise exposing the photopolymerizable liquid and film to actinic radiation which includes radiation of the first and second spectral regions to photopolymerize exposed areas of the liquid and film to form exposed photopolymerized areas over and within at least a portion of the holes wherein the exposed liquid in the holes is photopolymerized to a depth of at least 25% of the hole depth;

(d) removing unexposed areas of the photopolymerizable layer and liquid from the printed circuit substrate in formation of a polymerized solder mask thereon; and (e) contacting the printed circuit substrate with molten solder.

In preferred embodiments of the present invention the photopolymerizable film has a thickness not greater than 1.5 mils and more preferably not greater than 1.0 mil with holes in the printed circuit substrate being high-aspect-ratio holes with a height of the hole to its diameter of at least 4 and more preferably at least 5.

DETAILED DESCRIPTION OF THE INVENTION

Printed Circuit Substrate

The printed circuit substrates which are coated in accordance with the teachings of the present invention are varied and can be rigid or flexible. The substrate will generally be nonplanar, i.e., it will have a raised conductive relief on a nonconductive surface such as a conventional printed circuit pattern supported by a fiberglass epoxy board. The printed circuit substrate must contain holes extending partially through or completely through the substrate or a layer therein to allow electrical connections to be made. Depending on the circuit density and the number of layers to be connected, the through holes may have an aspect ratio which preferably is at least 4. Aspect ratio is a ratio of a height of the hole to its diameter.

Photopolymerizable Liquid

In the present process, the photopolymerizable liquid is applied to the printed circuit substrate to substantially fill holes which are present on the surface of the substrate. The photopolymerizable liquid comprises at least one ethylenically unsaturated compound capable of forming a high polymer by addition polymerization and a first photoinitiator system which is activatable by actinic radiation in a first spectral region. Typically, the photopolymerizable liquid is a low viscosity liquid containing as the major components one or more acrylic monomers and a photoinitiating system. The liquid may also contain other components conventionally present in a photopolymerizable solder mask or resist composition to modify the rheological properties of the liquid and/or the properties of the resulting processed photoresist or solder mask. Such components include: polymeric binders, fillers, thermal stabilizers, thermal crosslinking agents, colorants such as dyes and pigments, adhesion modifiers, liquid adjuvants such as plasticizers and solvents, coating aids, and the like.

Generally the viscosity of the liquid will not be greater than 400 centipoise and more preferably not greater than 200 centipoise.

Liquid Initiating System

The liquid initiating system is matched to the spectral absorption characteristics of the preformed photopolymerizable film, i.e., the liquid will polymerize due to a wavelength of actinic radiation which passes through the photopolymerizable film which is laminated onto the substrate through the liquid. Any of the initiators, initiator/sensitizer combinations or combinations thereof may be used as the photoinitiating system provided it is matched to the spectral absorption characteristics of the preformed photopolymerizable film. A photoinitiating system listed for use in the film could be employed in the liquid provided the film uses a different initiator system wherein different spectral sensitizers are utilized (and the film allows actinic radiation to pass and photopolymerize the liquid). For preformed photopolymerizable film having a spectral window in the 310 nm region, initiators such as 2-benzyl-2-dimethylamino-1-[4-(4-morpholinyl)phenyl]-1-butanone, ethyl-4-(dimethylamino)benzoate and mixtures thereof are useful as initiating systems for the photopolymerizable liquid. Also useful as initiating systems for the photopolymerizable liquid are systems which are sensitized to visible radiation such as the combination of the photoinitiator isopropyl thioxanthone with the spectral sensitizer ethyl-4-(dimethylamino)benzoate; the photoinitiator o-Cl-HABI, i.e., 1,1'-biimidazole, 2,2'-bis(o-chlorophenyl)-4,4',5,5'-tetraphenyl-, with the spectral sensitizer dimethoxy-JDI, i.e., 1H-inden-1-one, 2,3-dihydro-5,6-dimethoxy-2-[(2,3,6,7-tetrahydro-1H,5H-benzo[i,j]-quinolizin-9-yl)methylene]-; or the photoinitiator o-Cl-HABI with the spectral sensitizers dimethoxy-JDI and ethyl-4-(dimethylamino)benzoate.

Liquid Monomer

In addition to the matched photoinitiating system, the photopolymerizable liquid contains a monomoner such as a mono- or polyfunctional acrylate or methacrylate and preferred are such liquids containing monomers with two, three or more acrylate or methacrylate groups to allow concurrent crosslinking during the photopolymerization process. Suitable monomers for use in the liquid are the same as for the photopolymerizable film which are listed below. The monomer may be the same monomer as used in the photopolymerizable film or it may be different. A preferred monomer is tripropyleneglycol diacrylate.

Liquid Adjuvant

Liquid adjuvants such as solvents, plasticizers or the combinations thereof may be incorporated into the photopolymerizable liquid to adjust its coating characteristics and/or improve the resulting photohardened resist or solder mask. Preferred for solder mask applications are liquid plasticizers such as butyl benzyl phthalate, dibutyl phthalate, tricresylphosphate, glyceryl triacetate and mixtures thereof.

Preferred for photoresist applications are solvents such as methanol, ethanol, propanol, ethylene glycol, 2-butoxyethanol, butoxyethoxyethanol, and triethyleneglycol diacetate and the like.

Preformed Photopolymerizable Film

The preformed photopolymerizable film that is laminated to the printed circuit substrates can be varied and can be chosen from a wide variety of photoresist and solder mask films particularly those which are commercially available. The photopolymerizable film normally is adhered to a support film, e.g., a polyethylene terephthalate film, which is removed subsequent to the lamination procedure, and typically after exposure to actinic radiation. Illustrative of the many patents which disclose various layer formulations are U.S. Pat. Nos. 3,469,982, 4,293,635, 4,528,261, 4,548,884, and 4,698,294.

The photopolymerizable compositions used in the photoresist layer typically contains at least one nongaseous ethylenically unsaturated compound having a boiling point above 100° C. at normal atmospheric pressure and being capable of forming a high polymer by photoinitiated addition polymerization and an initiating system activated by actinic radiation, and typically contain a polymeric binder as well. The photopolymerizable composition typically contains other compounds conventionally added to modify the physical properties of the film for use as a solder mask. Such components include: fillers, thermal stabilizers, hydrogen donors, thermal crosslinking agents, colorants such as dyes and pigments, adhesion modifiers, coating aids, and the like.

In the prior art the photopolymerizable film has been formulated so that substantially all actinic radiation incident on the film is absorbed within the layer to prevent undesirable halation and print-through effects. (Print-through is unwanted imaging exposure on the back-side solder mask layer of a two sided printed circuit board which results from radiation incident on the front side of the board which passes through the front-side solder mask layer and the underlying translucent or transparent printed circuit substrate areas.) Although substantially all of the actinic radiation is absorbed within the photopolymerizable layer, sufficient polymerization typically occurs at the layer/substrate interface to insure the desired adhesion.

In the process of the present invention, a substantial difference is present in that the preformed photopolymerizable film absorbs substantially all actinic radiation in a spectral region but transmits at least a portion of the actinic radiation in another spectral region which readily allows photopolymerization of an underlying liquid. A spectral region is a region of ultraviolet and visible electromagnetic radiation spectrum which is bounded by radiation of specific wavelengths.

Practical photopolymerizable systems are typically exposed by actinic radiation with wavelengths between about 3000 and about 4000 angstroms and may be sensitized with spectral sensitizers so that visible radiation, e.g., green, yellow or red light, to effectively initiate polymerization. Typically, the photopolymerizable layer transmits substantial radiation at wavelengths above about 4000 angstroms and absorbs substantial radiation in the spectral region between about 3500 and about 4000 angstroms where the photoinitiator system is effective. In some instances the photopolymerizable layer absorbs only a portion of radiation in the spectral region between about 3000 and 3500 angstroms where the photoinitiator system consequently is less effective. For such a photopolymerizable layer, actinic radiation in the second spectral region is defined to between about 3500 and about 4000 angstroms where absorption is most effective and actinic radiation in the first spectral region is limited to be between about 3000 and about 3500 angstroms or above about 4000 angstroms where absorption is less effective or totally ineffective in initiating polymerization in the layer. In the process of the present invention, the photopolymerizable liquid contains a first photoinitiator system which is activatable in the first spectral region and the radiation incident on the photopolymerizable layer contains actinic radiation in both the first and second spectral regions, e.g., radiation from a mercury arc light source.

Film Monomer (Also Suitable for Liquid)

Preferred photopolymerizable compositions contain mono or polyfunctional acrylates or methacrylates and particularly preferred are such compositions containing monomers with two, three or more acrylate or methacrylate groups to allow concurrent crosslinking during the photopolymerization process. Suitable monomers which can be used as the sole monomer or in combination with others include those disclose in U.S. Pat. No. 3,380,831.

A suitable class of monomers include an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Preferred are those wherein at least one and preferably most of such linkages are conjugated with a double bonded carbon, including carbon double bonded to carbon and to such heteroatoms as nitrogen, oxygen and sulfur. Also preferred are such materials wherein the ethylenically unsaturated groups, especially the vinylidene groups, are conjugated with ester or amide structures.

A particularly preferred class of monomers are t-butyl acrylate, cyclohexyl acrylate, hydroxy $C_1$–$C_{10}$-alkyl acrylate, butane diol diacrylate, hexamethylene glycol diacrylate, triethylene glycol diacrylate, tripropylene glycol diacrylate, pentaerythritol triacrylate, trimethylolpropane triacrylate, polyoxyethylated trimethylolpropane triacrylate, di-(3-acryloxy-2-hydroxypropyl) ether of bisphenol-A, di-(3-acryloxy-2-hydroxypropyl) ether of tetrabromo-bisphenol-A, or methacrylate analogues thereof.

Film Photoinitiator System

The photoinitiator system has one or more compounds that directly furnish free-radicals when activated by actinic radiation in a second spectral region which is defined above. The system also may contain a sensitizer that is activated by the actinic radiation, causing the compound to furnish the free-radicals. Useful photoinitiator systems may contain a sensitizer that extends spectral response into the near ultraviolet, visible, and near infrared spectral regions provided that the resulting photopolymerizable layer absorbs only a portion of actinic radiation in the first spectral region.

A large number of free-radical generating compounds, including redox systems such as Rose Bengal/2-dibutylaminoethanol, may be selected to advantage. Photoreducible dyes and reducing agents such as those disclosed in U.S. Pat. Nos.: 2,850,445; 2,875,047; 3,097,096; 3,074,974; 3,097,097; 3,145,104; and 3,579,339; as well as dyes of the phenazine, oxazine, and quinone classes; ketones, quinones; 2,4,5-triphenylimidazolyl dimers with hydrogen donors, and mixtures thereof as described in U.S. Pat. Nos.; 3,427,161; 3,479,185; 3,549,367; 4,311,783; 4,622,286; and 3,784,557 can be used as initiators. Other initiators are dye-borate complexes disclosed in U.S. Pat. No. 4,772,541; and trichloromethyl triazines disclosed in U.S. Pat. Nos. 4,772,534 and 4,774,163. A useful discussion of dye sensitized photopolymerization can be found in "Dye Sensitized Photopolymerization" by D. F. Eaton in Adv. in Photochemistry, Vol. 13, D. H. Volman, G. S. Hammond, and K. Gollinick, eds., Wiley-Interscience, New York, 1986, pp. 427–487. Similarly, the cyclohexadienone compounds of U.S. Pat. No. 4,341,860 are useful as initiators.

Preferred photoinitiators include CDM-HABI, i.e., 2-(o-chlorophenyl)-4,5-bis(m-methoxyphenyl)-imidazole dimer; o-Cl-HABI, i.e., 1,1'-biimidazole, 2,2'-bis(o-chlorophenyl)-4,4',5,5'-tetraphenyl-; and TCTM-HABI, i.e., 1H-imidazole, 2,5-bis(o-chlorophenyl)-4-[3,4-dimethoxyphenyl], dimer, each of which is typically used with a hydrogen donor.

Sensitizers useful with photoinitiators include methylene blue and those disclosed in U.S. Pat. Nos. 3,554,753; 3,563,750; 3,563,751; 3,647,467; 3,652,275; 4,162,162; 4,268,667; 4,351,893; 4,454,218; 4,535,052; and 4,565,769. A preferred group of sensitizers include the bis(p-dialkylaminobenzylidene) ketones disclosed in Baum et al., U.S. Pat. No. 3,652,275, and the arylyidene aryl ketones disclosed in Dueber, U.S. Pat. No. 4,162,162.

Hydrogen donor compounds that function as chain transfer agents in the photopolymer compositions include: 2-mercaptobenzoxazole, 2-mercaptobenzothiazole, 4-methyl-4H-1,2,4-triazole-3-thiol, etc.; as well as various types of compounds, e.g., (a) ethers, (b) esters, (c) alcohols, (d) compounds containing allylic or benzylic hydrogen, (e) acetals, (f) aldehydes, and (g) amides disclosed in column 12, lines 18 to 58 of MacLachlan U.S. Pat. No. 3,390,996. Suitable hydrogen donor compounds for use in systems containing both biimidazole type initiator and N-vinyl carbazole are 5-chloro-2-mercaptobenzothiazole; 2-mercaptobenzothiazole; 1H-1,2,4-triazole-3-thiol; 6-ethoxy-2-mercaptobenzothiazole; 1-dodecanethiol; and mixtures thereof.

Film Polymeric Binder

The photopolymerizable layer typically contains one or more polymeric binders to modify adhesion, flexibility, hardness, oxygen permeability, moisture sensitivity and other mechanical or chemical properties required during its processing or end use as is well-known in the prior art.

In the case where aqueous development of the photosensitive composition is desirable, the binder should contain sufficient acidic or other groups to render the composition processible in aqueous developer. Useful aqueous-processible binders include those disclosed in U.S. Pat. Nos. 3,458,311 and 4,273,857. Useful amphoteric polymers include interpolymers derived from N-alkylacrylamides or methacrylamides, acidic film-forming comonomer and an alkyl or hydroxyalkyl acrylate such as those disclosed in U.S. Pat. No. 4,293,635. For aqueous development the photosensitive layer will be removed in portions which are not exposed to radiation but will be substantially unaffected during development by a liquid such as wholly aqueous solutions containing 1% sodium carbonate by weight.

Film Plasticizer

The photopolymerizable layer may also contain a plasticizer to modify adhesion, flexibility, hardness, solubility, and other mechanical or chemical properties required during its processing.

Suitable plasticizers include triethylene glycol, triethylene glycol diacetate, triethylene glycol dipropionate, triethylene glycol dicaprylate, triethylene glycol dimethyl ether, triethylene glycol bis(2-ethylhexanoate), tetraethylene glycol diheptanoate, poly(ethylene glycol), poly(ethylene glycol) methyl ether, isopropylnaphthalene, diisopropylnaphthalene, poly(propylene glycol), glyceryl tributyrate, diethyl adipate, diethyl sebacate, dibutyl suberate, phthalate esters such as dioctyl phthalate, tributyl phosphate, tris(2-ethylhexyl) phosphate, Brij® 30 [$C_{12}H_{25}(OCH_2CH_2)_4OH$], and Brij® 35 [$C_{12}H_{25}(OCH_2CH_2)_{20}OH$].

Film Crosslinking Agent

With photopolymerizable film used as a solder mask or other permanent coating a chemically or thermally activated crosslinking agent is preferably incorporated to improve high temperature characteristics, chemical resistance or other mechanical or chemical properties required in the end-use product. Suitable crosslinking agents include those disclosed in Gervay, U.S. Pat. No. 4,621,043 and Geissler et al., U.S. Pat. No. 4,438,189, such as melamines, ureas, benzoguanamines and the like.

Film Filler

The photopolymerizable layer may also contain particulates such as organic or inorganic fillers to modify the mechanical or chemical properties required during its processing or end use. Suitable fillers include organic or inorganic reinforcing agents which are essentially transparent as disclosed in U.S. Pat. No. 2,760,863, e.g., organophilic silica bentonite, silica, and powdered glass having a particle size less than 0.4 mil; inorganic thixotropic materials as disclosed in U.S. Pat. No. 3,525,615 such as boehmite alumina, clay mixtures of highly thixotropic silicate oxide such as bentonite and finely divided thixotropic gel containing 99.5% silica with 0.5% mixed metallic oxide; microcrystalline thickeners as disclosed in U.S. Pat. No. 3,754,920 such as microcrystalline cellulose and microcrystalline silicas, clays, alumina, bentonite, kalonites, attapultites, and montmorillonites; finely divided powders having a particle size of 5 millimicrons to 50 microns as disclosed in U.S. Pat. No. 3,891,441 such as silicon oxide, titanium oxide, carbon black, zinc oxide, and other commercially available pigments; and the binder-associated, transparent, inorganic particles as disclosed in European Patent Application 871130l3.4 such as magnesium silicate (talc), aluminum silicate (clay), calcium carbonate and alumina. Typically, the filler will be transparent to actinic radiation to preclude adverse effects during imaging exposure. Depending on its function in the photopolymerizable composition, the filler may be colloidal or have an average particle size of 50 microns or more in diameter.

Film Adhesion Promotor

When the photopolymerizable layer is used as a photoresist, a heterocyclic or mercaptan compound typically is added to improve adhesion of the coating to the metal required during processing. Suitable adhesion promoters include heterocyclics such as those disclosed in Hurley et al., U.S. Pat. No. 3,622,334, Jones, U.S. Pat. No. 3,645,772, and Weed, U.S. Pat. No. 4,710,262.

Other Film Components

The photopolymerizable layer may contain other components such as thermal polymerization inhibitors, dyes, pigments, and the like to stabilize, color or otherwise enhance the composition.

Thermal polymerization inhibitors that can be used in the photopolymerizable layer are: p-methoxyphenol, hydroquinone, and alkyl and aryl-substituted hydroquinones and quinones, tert-butyl catechol, pyrogallol, copper resinate, naphthylamines, betanaphthol, cuprous chloride, 2,6-di-tert-butyl-p-cresol, phenothiazine, pyridine, nitrobenzene and dinitrobenzene, p-toluquinone and chloranil. Also useful for thermal polymerization inhibitors are the nitroso compositions disclosed in U.S. Pat. No. 4,168,982.

Various dyes and pigments may be added to increase the visibility of the resist image. Any colorant used, however, should preferably be transparent to the actinic radiation used.

PROCESS

The photopolymerizable liquid and photopolymerizable film form a matched photoimagable system. The liquid is matched to the layer using the ultraviolet/visible absorption spectrum of the supported photopolymerizable film layer, i.e., the absorption of the unexposed dry film photoimageable solder mask film, to chose a suitable sensitizer/initiator for the liquid. The ultraviolet/visible absorption spectrum of the photopolymerizable liquid is determined from the absorption spectrum of a solvent solution of the sensitizer/initiator contained therein. The sensitizer/initiator selected for the matched system would possess substantial absorption in a spectral "window" of the dry film photoimageable solder mask film.

Any liquid/film lamination procedure may be used to apply the matched photoimageable system of this invention to a printed circuit substrate or panel. The matched photopolymerizable liquid and photopolymerizable resist of the present invention can be applied to the printed circuit substrate employing the VALU® System photoimagable solder mask application (a product of E. I. du Pont de Nemours and Company, Wilmington, Del.) which was employed in the examples. The laminating process and equipment encompassed by this System includes an input section wherein PC (printed circuit) panels are introduced into the system and coated with photopolymerizable liquid, a laminating section wherein a dry film photopolymerizable solder mask is laminated to the coated PC panels, a trimming section wherein excess laminated film is trimmed from the edges of the laminated PC panels, and a cleaning section wherein excess photopolymerizable liquid applied is rinsed from the laminated PC panels. The PC panels are transported through the System on-edge, i.e., in a vertical position.

The input section consists of a pair of vertical drive rollers for moving the PC panel through an applicator section into the laminating nip. The applicator section consists of two sequential vertical applicator pads with counterpoised positioning idler rollers for sequential contact application of photopolymerizable liquid to each side of and into through-holes in the PC panel, a pair of vertical, counterpoised, off-contact applicator pads displaced sufficiently to form a vertical curtain of photopolymerizable liquid, a pump to circulate photopolymerizable liquid from a sump through the applicator pads, and catch-pan under the applicator section and lamination section for returning drained, excess photopolymerizable liquid from the pads and the nip to the sump. The photopolymerizable liquid is pumped from the rear of the vertical applicator pads, through a 2 inch wide resilient, porous, foam pad faced with a fine mesh fabric to prevent pad wear and to filter out any particulate contamination. The photopolymerizable liquid employed typically has a Brookfield viscosity @ 25° C. of 13–25 CPS. At the end of the input section is a pair of vertical, undriven, heated, laminating rolls and two webs of dry film photopolymerizable solder mask (typically consisting of a 0.001–0.002 inch thick photosensitive solder mask layer on a 0.001 inch thick Mylar ® polyester filmbase) which are pulled around and between the laminating rolls by pull clamps so that the photosensitive solder mask surfaces form a nip at the nip of the laminating rolls. The laminating roll pressure typically is 40–60 psi, the laminating roll temperature typically is 140°–150° F. and lamination speed typically is about 4 fpm.

The PC panel typically will have dimensions ranging from 10×12 inches to 24×30 inches with thickness ranging from 0.03–0.25 inch. The PC panel typically will have through holes and raised circuit lines. The maximum circuit height which is processed is 0.005 inch and the maximum diameter through-hole that can be tented is about 0.03 inch (using a 0.002 inch thick solder mask film).

A PC panel is inserted between drive rollers which advance the panel between the first applicator pad and idler roller. The pad contacts one side of the panel surface and forces photopolymerizable liquid through the through-holes while the counterpoised idler roller maintains the alignment of the panel path. The panel is then advanced between the second applicator pad and idler roller. The pad contacts the opposite side of the panel surface and forces photopolymerizable liquid back through the through holes to insure bubble free filling of the holes. The leading edge of the panel is then advanced into the photopolymerizable liquid curtain without touching the surface of either of the applicator pads. The panel is stopped with the leading edge in the curtain, withdrawn from the curtain, cycled two or more times in-and-out of the curtain, to build up the thickness of the photopolymerizable liquid coating bead, and then the panel is advanced through the curtain with the panel surfaces being flooded with photopolymerizable liquid. The panel is immediately advanced into the nip of the laminating rolls where the photosensitive solder mask is laminated to each side of the photopolymerizable liquid flooded panel and simultaneously removes excess photopolymerizable liquid which drains to the catch-pan below. When the trailing edge of the PC panel exits the nip of the drive rollers, the panel is then advanced along the coating/laminating path by means of pull clamps which grip the laminated board as it first exits the laminating rolls. After the laminated panel exits the laminating rolls, excess laminated solder mask film is mechanically trimmed from the leading and trailing edges of the laminated panel. The laminated panel is then advanced through three consecutive water spray rinse chambers to remove any remaining applied photopolymerizable liquid and dried with an air knife.

Typically the boards are then cycled for two minutes in a pressure chamber at 80–100 psi to remove any micro-bubbles which may be present in the laminated film/photopolymerizable liquid. After lamination is complete, the laminated panel may be held between about 5 minutes and 90 minutes before imaging exposure of the solder mask. Preferably, the panel is processed immediately.

Imaging exposure, development, and curing of the laminated panel is carried out conventionally. After the hold time, the laminate is placed in a vacuum frame with a phototool on each laminate surface and exposed to UV radiation to form a photopolymer solder mask image on each side where unexposed areas are soluble and exposed areas are insoluble in an aqueous alkaline developer.

After a hold time of 10 minutes to 2 hours, the Mylar ® polyester films are removed and the exposed panel is developed conventionally in a 1% aqueous sodium carbonate solution to remove the unexposed solder mask areas and photopolymerizable liquid.

After a hold time, if any, the developed panel is cured by first exposing the developed panel to a UV exposure to further harden tented areas. The cure is then completed by baking the panel at about 300° F. for 1 hour to produce a solder mask protected PC panel with open through holes for insertion and soldering of component leads.

Tent failures have been observed after thermal curing and/or soldering wherein cracks are formed in the surface of the tent above the barrel of the hole. Such surface cracks may extend to the underlying circuit pad or they may be micro cracks confined to the surface area of the solder mask. In either case, the cracks absorb ionic contaminants during further processing which cannot be easily removed and which adversely impact the circuit board function. In gross tent failure the tented area ruptures and breaks free of the underlying pad and is pushed above the solder mask by the photopolymer core in the through hole barrel. Tented areas may contain other defects such as feather cracks and voids in the interior of the through hole barrels and raised solder mask portions over the through hole areas. Such defects, however, are not considered a tent failure provided they are free of surface cracks and ruptures.

Matched dry film/liquid combinations of this invention provide circuit boards containing through holes ranging from 9 to 30 mils which are substantially free of surface crack tenting failures. Candidate dry film/liquid combinations may be tested for tenting efficiency by the following tenting efficiency test.

Tenting Efficiency Test A

Tenting Efficiency Test A is met if 90% or more of each area above a hole and immediately surrounding the hole in the substrate are free of a surface crack. Preferably 99% or more of the areas are free of a surface crack.

The tenting efficiency of a liquid/film combination is measured a standardized test printed circuit board panel, a photopolymerizable liquid which is the subject of the test procedure and preformed photopolymerizable solder mask film which is the subject of the test procedure except the film is required to be of a 0.001 in thickness. The film is applied by lamination and therefore is supported with a film such as 0.001 in thick polyethylene terephthalate.

The description below is of the substrate employed in the Examples with four separate sections identified as Section 1, Section 2, Section 3 and Section 4. However, for the Tenting Efficiency Test only Section 2 and Section 3 are necessary. Therefore a test substrate can be made in accordance with presence or absence of Section 1 and Section 4 in its manufacture and with the presence or absence of Section 1 and Section 4 in undertaking the procedure.

The substrate is of nonuniform construction formed by lamination of three 0.030 inch thick layers of fiber glass-epoxy each having a width of 5.6 inches and a height of 9.0 inches wherein the lamination is in the presence or absence of copper layers on the two outer surface of the three fiber-glass epoxy layers and between the internal fiber-glass epoxy layers.

The substrate has four approximately equal sections across the width of the substrate (therefore without sections 1 and 4 the substrate will be 2.8 inches, each section having holes drilled through the thickness of the substrate wherein:

Section 1 contains in order a continuous surface of 1 mil copper plated to a total thickness of 2.1 to 2.3 mil copper on the two opposite external surfaces of the fiber glass epoxy laminate. There are no internal copper conductors present between the fiber glass-epoxy layers.

Section 2 contains circular copper portions (i.e., pads) of 9 mil diameter on the two opposite external surface of the fiber glass laminate. There are internal copper conductors of a 1 to 1.4 mil thickness sandwiched between portions of the two internal layers of the fiber glass-epoxy laminate such that any hole drilled through the laminate would only penetrate through one of the internal copper layers. (This section is referred in the examples as a multilayer panel.)

Section 3 contains circular copper portions (i.e., pads) of 9 mil diameter on the two opposite external surfaces of the fiber glass laminate. There are no internal copper conductors present between the fiber glass-epoxy layers. (This section is referred in the examples as a double sided panel.)

Section 4 contains no copper, i.e., no copper is present the two opposite external surfaces of the fiberglass-epoxy laminate and within the laminate.

Each of the four sections across the width contains a column having a width of 1.4 in parallel to the 9.0 in substrate height. In each column are six evenly spaced arrays of holes extending through the substrate with each array containing 10 by 10 drilled holes for a total of 100 holes with a different hole size in each array.

The hole sizes when walls are plated with copper are respectively 9 mil, 12 mil, 15 mil, 20 mil, 30 mil, and 40 mil. The unplated hole size is two mils larger, i.e., it is the drilled hole size. The size of the arrays range from 0.75×0.75 inches to 1.0×1.0 inches respectively from the 9 mil to 40 mil arrays.

In Section 1 copper is present on the walls of each hole in connecting continuous sheets of plated copper on opposite exterior surfaces of the substrate to duplicate electrical connections of external ground planes commonly found in printing wiring boards.

In Section 2, copper is present on the walls of each hole with each hole centered in each of the circular copper portions (i.e., pads) on opposite external surfaces of plated copper wherein one half of the holes extending through copper sandwiched between two internal fiber glass-epoxy layer interfaces alternating with the other half of the holes extruding through copper sandwiched between the other two internal fiber glass-epoxy large interfaces.

In Section 3 the walls of the holes are copper plated (to duplicate plated walls found commonly on double side boards).

In Section 4 the hole walls are not plated.

The test printed circuit board panel is precleaned in a suitable manner to present a clean surface. (A suitable technique involves immersing in an etchant to remove about 25 microinches from the copper surface. The etched board can be then rinsed well with water and then brush scrubbed in a Chemcut® Model No. 107 scrubber having 320 grit bristle brushes No. 35300. The panel can be dried in an oven at 300° F. for 5 to 10 minutes.)

The panel is immersed in a pan containing the photopolymerizable liquid and soaked for about 1 minute. The panel is removed from the liquid and while running-wet with the liquid, the photopolymerizable layer is laminated onto the panel through the polymerizable liquid.

Illustratively, one or two of the photopolymerizable film solder mask can be employed using the VALU® System for photoimagable solder mask application (a product of E. I. du Pont de Nemours and Company, Wilmington, DE). The laminating section of this System consists of a pair of vertical, undriven, heated, laminating rolls wherein two webs of the dry film photopolymerizable solder mask are pulled around and between the laminating rolls by pull clamps so that the photosensitive solder mask surfaces form a nip at the nip of the laminating rolls. The laminating roll pressure is 50+/−10 psi, the laminating roll temperature is 145+/−5° F. and lamination speed is about 4 fpm. In this procedure the wet panel is immediately inserted directly into the nip of the laminating rolls where the photosensitive solder mask is laminated to each side of the photopolymerizable liquid flooded panel. The panel is advanced along the laminating path by means of pull clamps which grip the laminated board as it first exits the laminating rolls. After the laminated panel exits the laminating rolls, excess laminated solder mask film is mechanically trimmed from the leading and trailing edges of the laminated panel. The laminated panel is then advanced through three consecutive water spray rinse chambers to remove any remaining applied photopolymerizable liquid and dried with an air knife.

Both sides of the laminated panel are then uniformly exposed to radiation from 5000 watt high pressure mercury lamps except areas along the edges of the panel are not exposed. The exposure is adjusted so that 11 to 12 steps on a 21 step Stouffer $\sqrt{2}$ exposure are retained after subsequent development.

The exposed panel is then developed in a spray processor with a conveyor speed adjusted so that the unexposed solder mask film is visibly removed within 30 seconds. (An example of a developer of 1% by weight $Na_2CO_3$ in aqueous solution employed of 105° F. in an ASI, ADS-24 spray processor.)

The developed panel is then cured in a suitable manner dependent upon the components of the liquid/film. Illustratively, the panel can be exposed to 3 Joules of radiation in an Argus International, Model No. 7125 UV Processor in with a 5000 watt medium pressure mercury exposure lamp. Curing can be completed by baking the panel for 1 hour at 300° F.

The cured panel is then fluxed with a suitable flux and dipped twice in molten solder at 500° F. for 5 seconds. (An example of a suitable flux is Levelite ® Flux and a suitable apparatus is a commercial Voss Levelite ® Model No. 220 vertical hot air solder leveler with 80 psi hot air pressure on its air knives.)

The panel is then inspected for cracking failure by examining each tented hole, i.e., the surface of the laminated film above each hole or immediately surrounding the hole with a 50 power optical microscope wherein both the front tent surface is illuminated and the hole is illuminated from the rear of the panel. If at least one crack is observed the tent is considered to have failed. Illustratively, a surface cracks can be annular shaped surrounding the hole or a segment thereof.

An alternate method of determining tent failure, i.e., cracking, is by use of a dye penetrant. An example of a dye penetrant crack detection system is Spotcheck ® dye penetrant system marketed by Magnaflux, Chicago, Ill. 60656. In the use of this system, the panel is first cleaned and then sprayed with a dye penetrant solution containing low boiling catalytic reformer fractionater distillates (CAS#68477-31-6), isobutane, normal $C_5$-$C_{20}$ paraffins (CAS#64771-72-8), propylene glycol, hydrotreated light naphthenic distillates (CAS#64742-53-6), and C.I. Solvent Red 19. The dye solution penetrates any cracks and the solution is allowed to dry. The dry panel is then wiped with a cloth to remove excess dye and is then sprayed with a developer which contains methyl chloroform, chlorodifluoromethane, calcium carbonate, ethoxylated nonylphenol (CAS#9106-45-9), amorphous silica, magnesium stearate, methalal, and tert-butyl alcohol and allowed to dry. The developer forms a white coating over the surface of the panel and dye which had penetrated any crack defect forms a red stain on the white background at the location of the cracked tent. This dye penetrant method is equivalent to the optical method supra for detecting cracks and is substantially faster.

Photohardened Plug Depth Test

A test printed circuit board panel (described supra) is processed as described in the Tenting Efficiency Test A with several modifications with determination the depth of liquid polymerization.

In this test procedure, only one side of the two sided laminated panel is uniformly exposed to actinic radiation such as with a Du Pont PC130 exposure unit. In this instance, the reverse side of laminated panel is masked with an opaque cover to prevent exposure (Alternatively lamps on a single side of the panel can be used). During development of the exposed panel, the entire solder mask film on the reverse side of the two sided panel is removed along with any unpolymerized liquid remaining in the holes. The developed panel is then cured, fluxed and soldered as described in the Tenting Efficiency Test A.

The length of the plug may be measured by physically pushing the photohardened plug from the barrel and measuring its length or by sectioning the panel along the length of the through hole barrel, i.e., a cross section of the through hole at its diameter and in a direction normal to the surface of the printed circuit substrate, and measuring the sectioned plug therein. To insure effective crack free tents, the depth of the photopolymerized plug should be 25% or more of the length of the hole barrel. Preferably the plug should be 30 mils long or longer.

In the following examples all parts and percentages are by weight and temperature is in degrees centigrade unless otherwise indicated. The term "tent" refers to an area of photopolymerized film above and immediately surrounding a hole in a printed circuit board substrate

EXAMPLE 1

VALU ® Type 8220 photopolymer film solder mask was employed which is a three ply photopolymerizable film web stored in roll form of a polyethylene terephthalate temporary support film, a 2 mil thick photopolymerizable solder mask layer and a removable polyethylene protective coversheet which is removed just prior to lamination. The absorption spectrum of Type 8220 film was determined by removing the coversheet from a film sample and measuring its absorption in a Varian ® Model DMS 300 UV/visible Spectrophotometer. (The support film is substantially transparent to the wavelengths employed for polymerization.) The spectrum had major absorption maxima at 357.5 nm and 286.2 nm and minima at 510.9 nm, 7.8 nm and 310.3 nm.

Liquids used in this evaluation contained tripropylene glycol diacrylate (TRPGDA) as the monomer along with one or more of the following initiator/sensitizer compounds. The absorption spectra of these compounds was determined as a methanol solution using the spectrophotometer described supra.

Irgacure ® 369 is 2-benzyl-2-dimethylamino-1-[4-(4-morpholinyl)phenyl]-1-butanone and a solution of 0.0034 g of the compound in 100 g methanol had strong absorption at 322.2 nm which overlaps the 310 minima of the film.

Quanticure ® EPD is ethyl-4-(dimethylamino)benzoate and a solution of 0.0014 g of the compound in 100 g methanol had the spectrum which had strong absorption at 277.9 nm which overlaps in part the 310 minima of the film.

Quanticure ® ITX is a mixture of 2-and -4-isopropyl thioxanthone and a solution of 0.001 g of the compound in 100 ml methanol had the spectrum which absorbed strongly at 258.5 nm and moderately at 382.6 nm which is effectively masked by the absorption of the VALU ® Type 8220 film. o-Cl-HABI is 1,1'-biimidazole, 2,2'-bis-(o-chlorophenyl)-4,4',5,5'-tetraphenyl-, and a solution of 0.0014 g of the compound in 100 ml methanol had the spectrum which absorbed at 204.3 and 261.4 nm which is masked by the absorption of the VALU ® Type 8220 film.

Dimethoxy-JDI is 1H-inden-1-one, 2,3-dihydro-5,6-dimethoxy-2-[(2,3,6,7-tetrahydro-1H,5H-benzo[i,j-]quinolizin-9-yl)methylene]-, and a solution of 0.0014 g of the compound in 100 g methanol had a spectrum with strong absorption at 456.2 nm which is longer than the effective absorption of the VALU ® Type 8220 film.

A solution of 0.0044 g of o-Cl-HABI and 0.0021 g of Dimethoxy-JDI in 100 ml methanol had the spectrum with strong absorption at 455.2 nm which absorption differs and is above the major absorption region of the film.

Liquids were prepared having the compositions designated in the following Table 1:

TABLE 1

| COMPONENT | COMPOSITION (grams) | | | | |
|---|---|---|---|---|---|
| | X | A | B | C | D |
| TRPGDA | 300 | 294 | 294 | 294 | 300 |
| Irgacure ® 369 | — | 6 | 6 | 6 | — |
| Quanticure ® EPD | — | — | 3 | — | 3 |
| Quanticure ® ITX | — | — | — | 3 | — |
| o-Cl-HABI | — | — | — | — | 3 |
| Dimethoxy JDI | — | — | — | — | 0.6 |

Each liquid was tested on two panels using the Tenting Efficiency Test A procedure described supra using the test printed circuit board panel described above except the solder mask film was 2 mils thick. Processing conditions included:

Uniform exposure to radiation from each 5000 watt high pressure mercury lamp.
First panel—400 milli Joules/cm$^2$.
Second panel—250 milli Joules/cm$^2$.
Each exposed panel was developed in 1% by weight Na$_2$CO$_3$.H$_2$O solution at 105° F. in an ASI, ADS-24 spray processor with a conveyor speed adjusted so that the unexposed solder mask was visibly removed within 56 seconds.

Curing exposure to 3 Joules of radiation from each 5000 watt medium pressure mercury lamp. (For Sample X the UV exposure was carried out in two steps, a first exposure of 2 Joules followed by a second exposure of 3 Joules.)

The yields determined by the dye penetrant system for the panels tested are given in Table 2.

TABLE 2

| PANEL | YIELD % | | | | |
|---|---|---|---|---|---|
| | X | A | B | C | D |
| DOUBLE SIDE | | | | | |
| 250 mJ/cm$^2$ | 38.6 | 100. | 100. | 99.8 | 98.8 |
| 400 mJ/cm$^2$ | 20.0 | 98.6 | 100. | 100. | 60.8 |
| MULTILAYER | | | | | |
| 250 mJ/cm$^2$ | 19.8 | 100 | 99.2 | 88.4 | 83.8 |
| 400 mJ/cm$^2$ | 20.0 | 97.8 | 87.8 | 0.0 | 43.4 |

The boards were also visually inspected using a 20 to 50 power (zoom) microscope with the inspection including the 50 power setting. Cracking failure or the absence thereof correlated with yields observed with the dye penetrant testing.

The Liquid X surface was observed to within tent areas which were domed and in some instances, e.g., 12 to 9 through holes, the material in through hole barrels was extruded above the surface. In contrast, the panels prepared with the matched sensitizers were flat. The barrels of holes for panels prepared with Liquid X. contained both voids and feather like cracks within the barrels. Likewise panels prepared with matched sensitizers contained some interior feather cracks and voids.

These tests indicate that the tenting yields are dramatically increased by the use of the matched initiator systems of this invention.

EXAMPLE 2

Example 1 was repeated except that the liquid was 195 g of TRPGDA, 2.5 g of Quanticure ® ITX and 2.5 g of Quanticure ® EPD (Liquid E); the VALU ® photopolymer film solder mask was Type 8210 (which is the same as Type 8220 in all respects except it is 1 mil thick) and the development time-to-clear was 23 seconds.

Results using Liquid E were compared with results using Liquid X, i.e., TRPGDA alone. In this instance the combined yield of multilayer and double sided panels for Liquid X was 43.7%. In contrast the combined yield for Liquid E was 85.8%. Yields of greater than 90% is expected for Liquid E upon concentration adjustments.

EXAMPLE 3

This example demonstrates the effect of additives such as liquid diluents and polymers on the matched sensitized liquid of this invention. Example 1 was repeated except that the liquid was Liquid A containing the additive listed in Table 3 and the VALU ® photopolymer film solder mask was Type 8210 (which is the same as Type 8220 in all respects except it is 1 mil thick). Additives used were methanol, diethylene glycol, or one of the following: Santicizer ® 160 plasticizer which is butyl benzyl phthalate.

Ebecryl ® 585 resin is a blend of chlorinated polyester in 40% TRPGDA (tripropylene diacrylate glycol) having a viscosity of 4,700 cps at 25° C. and an acid value of 15.

Ebecryl ® 588 resin is a blend of chlorinated polyester in 40% OTA-480 (glycerol propoxylate triacrylate) having a viscosity of 40,000 cps at 25° C. and an acid value of 15.

Ebecryl ® 745 is a acrylic oligomer diluted with 46% monomer proprietary blend with viscosity of 30,000 at 25° C. and with a Gardiner color of 20.

TABLE 3

| COMPONENT | COMPOSITION (grams) | | | | | | |
|---|---|---|---|---|---|---|---|
| | A | F | G | H | I | J | K |
| Liquid A | 300 | 300 | 300 | 300 | 300 | 300 | 300 |
| Methanol | | 6 | | | | | |
| Diethylene Glycol | | | 15 | | | | |
| Santicizer ® 160 | | | | 21 | | | |
| Ebecryl ® 585 | | | | | 60 | | |
| Ebecryl ® 588 | | | | | | 60 | |
| Ebecryl ® 745 | | | | | | | 60 |

Printed circuit board panels were processed as described in Example 1 using the liquids and Type 8210 solder mask film with a development time-to-clear of 23 seconds. The yields for the panels tested are given in Table 4.

TABLE 4

| PANEL | YIELD % | | | | | | |
|---|---|---|---|---|---|---|---|
| | A | F | G | H | I | J | K |
| DOUBLE SIDE | 96.4 | 62.2 | 52.4 | 99.8 | 99.2 | 94.8 | 98.6 |
| MULTILAYER | 97.8 | 70.8 | 49.8 | 99.4 | 99.8 | 96.0 | 95.2 |

In general tent failures were biased towards the 20 and 30 mil holes. Liquid A produced high yields with the 1 mil film but there was moderate sized internal voids, and feather cracking in holes. Liquid F containing methanol was similar to Liquid A except yield was reduced and voids and feather cracking was magnified in scale. Liquid G containing diethylene glycol produced cracks around hole rims, but had moderate internal voids and few feather cracks. Liquid H containing butyl benzyl phthalate produced panels which were improved over those from Liquid A and had small voids and only very small feather cracks in the barrels. Liquids I and J both had many cracks at the barrel rims and Liquid K had large voids with some wall defects.

Liquid H containing butyl benzyl phthalate was judged best in this example for producing defect free printed circuit panels.

EXAMPLE 4

Example 3 was repeated using Photomer ® 4039 UV curing agent in place of TRPGDA. Photomer ® 4039 UV curing agent is an ethoxylated phenol monoacrylate ($C_{15}H_{20}O_5$) having a molecular weight of 280. Photomer ® 4039 when used by itself, i.e., as a control liquid, is identified as Liquid Y. Liquid L contains 300 g of Photomer ® 4039 and 6 g of Irgacure ® Liquid M contains 240 g of Photomer ® 4039, 60 g of Photomer ® 4025 and 6 g of Irgacure ® 369. (Photomer ® 4025 is an ethoxylated bis phenol-A diacrylate.)

Printed circuit board panels were processed as described in Example 1 using the liquids, Type 8210 solder mask film, and a development time-to-clear of 23 seconds. The yields for the panels tested are given in Table 5.

TABLE 5

| PANEL TYPE | YIELD % | | |
|---|---|---|---|
| | Y | L | M |
| DOUBLE SIDE | 46.4 | 100 | 100 |
| MULTILAYER | 46.4 | 100 | 100 |

Printed circuit panels prepared from Liquid Y, i.e., without the matched sensitizer had a reduced tent yield. Printed circuit panels prepared from both Liquids L and M had no tent failures. Panels prepared from Liquid L had some minor doming, moderate internal voids, moderate cracks, and uniform film polymerized areas above all holes including 40 mil holes. Panels prepared from Liquid M had very flat polymerized film areas above holes, very small internal voids, no detectable cracks, and uniform polymerized areas above all holes including 40 mil holes. The printed circuit panel prepared from Liquid M was considered to be a perfect panel as judged by industry standards.

EXAMPLE 5

This example demonstrates the effect on hole photopolymerization depth of a preferred initiator system, when VALU ® Type 8210 photopolymer film solder mask is used for the test printed circuit board panels.

Three liquids were evaluated using the Photohardened Plug Depth Test described supra; Liquid X (TRPGDA), Liquid A (Consisting of 6 g of Irgacure ® 369 in 294 g of TRPGDA), and Liquid N (Consisting of 3 g Irgacure ® 369, 296.4 g of TRPGDA, and 0.6 g of 3-mercaptotetrazole adhesion promoter).

Each liquid was tested on a panel using the Photohardened Plug Depth Test procedure described supra wherein the processing conditions were:

Uniform exposure to 150 milli Joules/cm$^2$ radiation from the 5000 watt high pressure mercury lamp.

Curing exposure to 2 Joules of radiation from the 5000 watt medium pressure mercury lamp.

In this instance the photohardened plugs were measured and the average plug depth is presented in the following Table 6.

TABLE 6

| | AVERAGE PLUG DEPTH (MILS) | | |
|---|---|---|---|
| HOLE SIZE | X | A | N |
| 9 | 6.5 | 40.8 | 52.3 |
| 20 | 9.0 | 36.8 | 31.0 |
| 30 | 7.3 | 35.9 | 37.6 |

For liquids A and N which have very high yields, the average plug depth is at least 31 mils or greater which is more than half the barrel depth of the holes, and a factor of 3 or more deeper than the average plug depth for liquid X containing no matched initiator system.

What is claimed is:

1. A process for applying a photopolymerizable solder mask layer to a printed circuit substrate containing a plurality of holes which comprises the steps of
    (a) applying to the substrate surface, a photopolymerizable liquid to substantially fill the holes, the photopolymerizable liquid comprising at least one ethylenically unsaturated compound capable of forming a high polymer by addition polymerization and a first photoinitiator system which has an absorption maximum in a first spectral region, and is activated by actinic radiation therein;
    (b) laminating a preformed photopolymerizable film to the substrate through the applied liquid, the preformed photopolymerizable film having a thickness not greater than 2.0 mils comprising at least one ethylenically unsaturated compound capable of forming a high polymer by addition polymerization and a second photoinitiator system, wherein the preformed photopolymerizable film has an absorption maximum in a second spectral region and is activated by actinic radiation therein and has an absorption minimum in the first spectral region and transmits actinic radiation therein, with the proviso that the combination of the photopolymerizable liquid and preformed photopolymerizable film meets the requirements of Tenting Efficiency Test A;
    (c) imagewise exposing the photopolymerizable liquid and film to actinic radiation which includes radiation of the first and second spectral regions to photopolymerize exposed areas of the liquid and film to form exposed photopolymerized areas over and within at least a portion of the holes wherein the exposed liquid in the holes is photopolymerized to a depth of least 25% of he hole depth;
    (d) removing unexposed areas of the photopolymerizable film and liquid from the printed circuit substrate in formation of a polymerized solder mask thereon; and
    (e) contacting the printed circuit substrate with molten solder.

2. The process of claim 1 wherein the preformed photopolymerizable film layer has a thickness not greater than 1.5 mil.

3. The process of claim 1 wherein the holes are high-aspect-ratio holes with a height of the hole to its diameter of at least 4.

4. The process of claim 2 wherein the holes are high-aspect-ratio holes with a height of the hole to its diameter of at least 5.

5. The process of claim 1 wherein the transmitted portion of the actinic radiation in the first spectral region has wavelengths longer than the wavelengths of the actinic radiation in the second spectral region.

6. The process of claim 5 wherein the transmitted portion of the actinic radiation in the first spectral region is longer than 4000 Angstroms.

7. The process of claim 5 wherein the transmitted portion of the actinic radiation in the first spectral region is between about 4000 Angstroms and about 5000 Angstroms.

8. The process of claim 1 wherein the transmitted portion of the actinic radiation in the first spectral region is below 4000 Angstroms.

9. The process of claim 8 wherein the transmitted portion of the actinic radiation in the first spectral region is between about 3000 Angstroms and about 3500 Angstroms.

10. The process of claim 1 wherein the developed solder mask is cured between steps (d) and (e) by uniformly exposing the exposed areas of the photopolymerizable film layer and liquid to actinic radiation to substantially harden all of the liquid in the holes.

11. The process of claim 1 wherein the developed solder mask is thermally cured between steps (d) and (e) to substantially harden all of the liquid in the holes.

12. The process of claim 1 wherein the photopolymerizable liquid contains a liquid plasticizer.

13. The process of claim 12 wherein the liquid plasticizer is taken from the group consisting of butyl benzyl phthlate, dibutyl phthalate, tricresylphosphate, glyceryl triacetate, and mixtures thereof.

* * * * *